(12) United States Patent
Wang et al.

(10) Patent No.: US 11,527,676 B2
(45) Date of Patent: Dec. 13, 2022

(54) LIGHT-EMITTING UNIT AND METHOD FOR MANUFACTURING THE SAME

(71) Applicant: BOE Technology Group Co., Ltd., Beijing (CN)

(72) Inventors: Guoqiang Wang, Beijing (CN); Jiushi Wang, Beijing (CN); Qingzhao Liu, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 161 days.

(21) Appl. No.: 16/760,475

(22) PCT Filed: Oct. 29, 2019

(86) PCT No.: PCT/CN2019/114099
§ 371 (c)(1),
(2) Date: Apr. 30, 2020

(87) PCT Pub. No.: WO2020/088470
PCT Pub. Date: May 7, 2020

(65) Prior Publication Data
US 2021/0226091 A1 Jul. 22, 2021

(30) Foreign Application Priority Data
Nov. 1, 2018 (CN) .......................... 201811296440.0

(51) Int. Cl.
*H01L 33/24* (2010.01)
*H01L 33/00* (2010.01)
(Continued)

(52) U.S. Cl.
CPC .......... *H01L 33/24* (2013.01); *H01L 33/0075* (2013.01); *H01L 33/38* (2013.01);
(Continued)

(58) Field of Classification Search
CPC ..... H01L 33/24; H01L 33/0075; H01L 33/38; H01L 33/44; H01L 2933/0016; H01L 2933/0025; H01L 33/0066; H01L 33/20
See application file for complete search history.

(56) References Cited

U.S. PATENT DOCUMENTS 9,847,448 B2 * 12/2017 Dasgupta .............. H01L 33/325
2002/0117677 A1 8/2002 Okuyama et al.
(Continued)

FOREIGN PATENT DOCUMENTS

CN 1447990 A 10/2003
CN 1628391 A 6/2005
(Continued)

OTHER PUBLICATIONS

International search report of PCT application No. PCT/CN2019/114099 dated Jan. 23, 2020.
(Continued)

*Primary Examiner* — Su C Kim
(74) *Attorney, Agent, or Firm* — Fay Sharpe LLP

(57) ABSTRACT

A light-emitting unit and a method for manufacturing the same are provided. The light-emitting unit includes a first semiconductor layer, a light-emitting layer and a second semiconductor layer that are distributed in a stacking manner. At least one of the first semiconductor layer or the second semiconductor layer is at least in contact with a part of layer surfaces and a part of side of the light-emitting layer, the first semiconductor layer is insulated from the second semiconductor layer, and one of the first semiconductor layer and the second semiconductor layer is an N-type semiconductor layer, and the other is a P-type semiconductor layer. The present disclosure is conducive to increasing the light-emitting area and the light extraction efficiency of the light-emitting unit.

18 Claims, 5 Drawing Sheets

(51) Int. Cl.
    *H01L 33/38* (2010.01)
    *H01L 33/44* (2010.01)
(52) U.S. Cl.
    CPC ...... *H01L 33/44* (2013.01); *H01L 2933/0016* (2013.01); *H01L 2933/0025* (2013.01)

(56) References Cited

U.S. PATENT DOCUMENTS

| | | | |
|---|---|---|---|
| 2003/0107047 A1* | 6/2003 | Okuyama | H01L 21/0254 257/95 |
| 2004/0266043 A1 | 12/2004 | Oohata et al. | |
| 2005/0145865 A1 | 7/2005 | Okuyama et al. | |
| 2018/0090639 A1 | 3/2018 | Ting et al. | |

FOREIGN PATENT DOCUMENTS

| | | | |
|---|---|---|---|
| CN | 1698213 | A | 11/2005 |
| CN | 101364628 | A | 2/2009 |
| CN | 107768495 | A | 3/2018 |
| CN | 109411583 | A | 3/2019 |
| JP | 2015153883 | A | 8/2015 |
| KR | 20090022286 | A | 3/2009 |

OTHER PUBLICATIONS

First office action of Chinese application No. 201811296440.0 dated Jul. 29, 2019.
Second office action of Chinese application No. 201811296440.0 dated Mar. 9, 2020.

* cited by examiner ical projection of the first elec-
LIGHT-EMITTING UNIT AND METHOD FOR MANUFACTURING THE SAME The present disclosure is a 371 of PCT Application No. PCT/CN2019/114099 filed on Oct. 29, 2019, which claims priority to Chinese Patent Application No. 201811296440.0, filed on Nov. 1, 2018 and entitled "LIGHT-EMITTING UNIT AND MANUFACTURING METHOD THEREOF, AND DISPLAY DEVICE", the entire contents of which are incorporated herein by reference.

TECHNICAL FIELD

The present disclosure relates to a light-emitting unit and a method for manufacturing the same.

BACKGROUND

The micro light-emitting diode (micro LED) technology, namely, the LED device miniaturizing and matrixing technology, refers to that an array of high-density micro LED devices is integrated on one chip. The micro LED devices have the characteristics of high light-emitting efficiency, high brightness, high resolution, and high response speed. Accordingly, it is an inevitable development trend that the micro LED devices are applied in display products.

SUMMARY

According to a first aspect, a light-emitting unit is provided. The unit includes:

a first semiconductor layer, a light-emitting layer and a second semiconductor layer which are distributed in a stacking manner, at least one of the first semiconductor layer or the second semiconductor layer is at least in contact with a part of layer surface and a part of side of the light-emitting layer; the first semiconductor layer is insulated from the second semiconductor layer, one of the first semiconductor layer and the second semiconductor layer is an N-type semiconductor layer, and the other is a P-type semiconductor layer.

Optionally, the second semiconductor layer at least covers a part of a top surface and the part of side of the light-emitting layer, and the top surface of the light-emitting layer is a surface, which is away from the first semiconductor layer, of two layer surfaces of the light-emitting layer.

Optionally, the second semiconductor layer covers all the top surface and all the side of the light-emitting layer.

Optionally, the first semiconductor layer has a first convex structure, and the light-emitting layer at least covers a part of a top surface and a part of a side of the first convex structure.

Optionally, the side of the light-emitting layer is inclined with respect to a bottom surface of the first semiconductor layer; or, the side of the light-emitting layer is vertical with respect to a bottom surface of the first semiconductor layer.

Optionally, an orthographic projection of a top surface of the light-emitting layer on the first semiconductor layer is located within an orthographic projection of the light-emitting layer on the first semiconductor layer.

Optionally, a light-emitting surface of the second semiconductor layer has at least one second convex structure.

Optionally, a light-emitting surface of the second semiconductor layer has a plurality of the second convex structures, and the plurality of the second convex structures are evenly distributed.

Optionally, the light-emitting unit further includes a first electrode and a second electrode, the first electrode is electrically connected with the first semiconductor layer, and an orthographic projection of the light-emitting layer on the first semiconductor layer is staggered from an orthographic projection of the first electrode on the first semiconductor layer; and the second electrode is electrically connected with the second semiconductor layer, and the orthographic projection of the light-emitting layer on the first semiconductor layer is staggered from an orthographic projection of the second electrode on the first semiconductor layer.

Optionally, the first semiconductor layer includes a first light-emitting drive portion and a first extension portion, and an orthographic projection of the light-emitting layer on the first semiconductor layer coincides with the first light-emitting drive portion and is staggered from the first extension portion, and the first electrode is located on the first extension portion and electrically connected with the first extension portion; and the second semiconductor layer includes a second light-emitting drive portion and a second extension portion, and the orthographic projection of the light-emitting layer on the first semiconductor layer is located within an orthographic projection of the second light-emitting drive portion on the first semiconductor layer, the orthographic projection of the light-emitting layer on the first semiconductor layer is staggered from an orthographic projection of the second extension portion on the first semiconductor layer, and the second electrode is located on the second extension portion and electrically connected with the second extension portion.

Optionally, the light-emitting unit further includes a refractive layer, and the refractive layer is located on one side, which is away from the first semiconductor layer, of the second semiconductor layer.

Optionally, the difference between a refractive index of the second semiconductor layer and a refractive index of the refractive layer is less than a preset threshold, and the light transmittance of the refractive layer is greater than that of the second semiconductor layer; or, the refractive index of the refractive layer is smaller than that of the second semiconductor layer, and the refractive index of the refractive layer is greater than that of air.

Optionally, a light-emitting surface of the refractive layer has at least one third convex structure.

Optionally, a light-emitting surface of the refractive layer has a plurality of third convex structures, and the plurality of third convex structures are evenly distributed.

Optionally, a material for the second semiconductor layer includes gallium nitride doped with metal, and a material for the refractive layer includes silicon nitride.

Optionally, the light-emitting unit includes a micro LED device.

According to a second aspect, a method for manufacturing a light-emitting unit is provided. The method includes:

forming a first semiconductor layer;

forming a light-emitting layer on one side of the first semiconductor layer; and forming a second semiconductor layer on one side, which is away from the first semiconductor layer, of the light-emitting layer; and wherein at least one of the first semiconductor layer or the second semiconductor layer is at least in contact with a part of layer surfaces and a part of side of the light-emitting layer, the first semiconductor layer is insulated from the second semiconductor layer, and one of the first semiconductor layer and the second semiconductor layer is an N-type semiconductor layer and the other is a P-type semiconductor layer.

Optionally, the forming a first semiconductor layer includes:

forming a first semiconductor thin film layer; and patterning the first semiconductor thin film layer to obtain the first semiconductor layer, wherein one surface of the first semiconductor layer has a first convex structure; and the forming a light-emitting layer on one side of the first semiconductor layer includes:

forming a light-emitting thin film layer on one side, which has the first convex structure, of the first semiconductor layer; and patterning the light-emitting thin film layer to obtain the light-emitting layer, wherein the light-emitting layer at least covers a part of a top surface and a part of side of the first convex structure.

Optionally, the forming the second semiconductor layer on one side, which is away from the first semiconductor layer, of the light-emitting layer includes:

forming a second semiconductor thin film layer on one side, which is away from the first semiconductor layer, of the light-emitting layer; and patterning the second semiconductor thin film layer to obtain the second semiconductor layer, wherein a light-emitting surface of the second semiconductor layer has at least one second convex structure.

Optionally, after forming the second semiconductor layer on one side, which is away from the first semiconductor layer, of the second semiconductor layer, the method further includes:

forming a refractive layer on one side, which is away from the first semiconductor layer, of the second semiconductor layer.

Optionally, the forming the refractive layer on one side, which is away from the first semiconductor layer, of the second semiconductor layer includes:

forming a refractive thin film layer on one side, which is away from the first semiconductor layer, of the second semiconductor layer; and patterning the refractive film layer to obtain the refractive layer, wherein a light-emitting surface of the refractive layer has at least one third convex structure.

Optionally, after forming the first semiconductor layer, the method further includes:

forming a first electrode on one side of the first semiconductor layer;

after forming a second semiconductor layer on one side, which is away from the first semiconductor layer, of the light-emitting layer, the method further includes:

forming a second electrode on one side, which is away from the first semiconductor layer, of the second semiconductor layer.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

Figure 1:
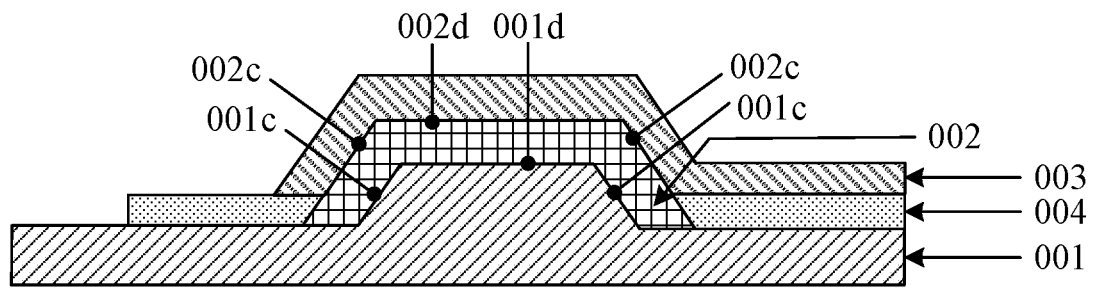
FIG. 1 is a schematic diagram showing a structure of a light-emitting unit according to an embodiment of the present disclosure.

For clearer descriptions of the principles, technical solutions and advantages in the embodiments of the present disclosure, the present disclosure is described in detail below in combination with the accompanying drawings.

In the inventor's knowledge, a current micro LED (light-emitting diode) device includes a light-emitting layer, as well as an N-type semiconductor layer and a P-type semiconductor layer which are located on two sides of the light-emitting layer. The N-type semiconductor layer is in contact with a top surface of the light-emitting layer. The P-type semiconductor layer is in contact with a bottom surface of the light-emitting layer. Meanwhile, a contact surface between the light-emitting layer and the N-type semiconductor layer and a contact surface between the light-emitting layer and the P-type semiconductor layer are both plane, which makes the light-emitting area of the micro LED device smaller, so that the light extraction efficiency of the micro LED device is lower. The light extraction efficiency may be a percentage of the number of photons emitted into a free space per unit time to the number of photons generated by recombination of electrons and holes per unit time. The top surface of the light-emitting layer may be a surface, which is away from the P-type semiconductor layer, of the surface of the light-emitting layer, and the bottom surface of the light-emitting layer may be a surface, which is in contact with the P-type semiconductor layer, of the surface of the light-emitting layer.

An embodiment of the present disclosure provides a light-emitting unit. The light-emitting unit includes a first semiconductor layer, a light-emitting layer and a second semiconductor layer that are distributed in a stacking manner. At least one of the first semiconductor layer and the second semiconductor layer is at least in contact with a part of layer surface and a part of side of the light-emitting layer, and the first semiconductor layer is insulated from the second semiconductor layer. One of the first semiconductor layer and the second semiconductor layer is an N-type semiconductor layer, and the other is a P-type semiconductor layer. Since at least one of the first semiconductor layer or the second semiconductor layer is at least in contact with the part of the layer surface and the part of the side of the light-emitting layer, both the layer surfaces and the side of the light-emitting layer may emit light, so that the light-emitting area of the light-emitting layer is relatively large. Therefore, the light-emitting unit has a larger light-emitting area and a higher light extraction rate. The light-emitting unit is usually located on a base substrate. The surface of the light-emitting layer includes the layer surface and the side. The side of the light-emitting layer usually intersects a substrate surface of the base substrate. The layer surface of the light-emitting layer may be the surface of the light-emitting layer except the side of the light-emitting layer.

Optionally, the second semiconductor layer is in contact with the part of the layer surface and the part of the side of the light-emitting layer. The embodiment of the present disclosure will be described by taking an example that the second semiconductor layer at least covers the part of the layer surface and the part of the side of the light-emitting layer. For example, reference is made to FIG. 1, which is a schematic diagram showing a structure of a light-emitting unit according to an embodiment of the present disclosure. As shown in FIG. 1, the light-emitting unit may include a first semiconductor layer 001, a light-emitting layer 002 and a second semiconductor layer 003 which are distributed in a stacking manner. The second semiconductor layer 003 at least covers a part of a top surface 002*d* and a part of side 002*c* of the light-emitting layer 002. The first semiconductor layer 001 is insulated from the second semiconductor layer 003. One of the first semiconductor layer 001 and the second semiconductor layer 003 is an N-type semiconductor layer, and the other is a P-type semiconductor layer. For example, the first semiconductor layer 001 may be an N-type semiconductor layer, and the second semiconductor layer 003 may be a P-type semiconductor layer. Alternatively, the first semiconductor layer 001 may be a P-type semiconductor layer, and the second semiconductor layer 003 may be an N-type semiconductor layer, which will not be defined in this embodiment of the present disclosure.

The top surface 002*d* of the light-emitting layer 002 may be one face, which is away from the first semiconductor layer 001, of the two layer surfaces of the light-emitting layer 002. It is readily understood that the light-emitting unit is usually located on the base substrate. The first semiconductor layer 001, the light-emitting layer 002 and the second semiconductor layer 003 may be stacked in a direction away from the base substrate. The top surface 002*d* of the light-emitting layer 002 may also be a surface, which is away from the base substrate, of the surface of the light-emitting layer. The side 002*c* of the light-emitting layer 002 may be a surface, which intersects the top surface 002*d* of the light-emitting layer 002 and the substrate surface of the base substrate, of the surface of the light-emitting layer 002.

In summary, the light-emitting unit provided by the embodiment of the present disclosure includes the first semiconductor layer, the light-emitting layer and the second semiconductor layer that are distributed in a stacking manner. The second semiconductor layer at least covers the part of the top surface and the part of the side of the light-emitting layer. Accordingly, the part of the top surface and the part of the side of the light-emitting layer may emit light, so that both the top surface and the side of the light-emitting unit may emit light, which is conducive to increasing the light-emitting area of the light-emitting unit. Therefore, the light extraction efficiency of the light-emitting unit is increased.

Optionally, the second semiconductor layer 003 covers all the top surface 002*d* and all the side 002*c* of the light-emitting layer 002. In this way, all the top surface and all the side of the light-emitting unit may emit light, and thus the light-emitting area of the light-emitting unit is substantially increased.

It should be noted that that a film layer A covers a surface C of a film layer B herein may refer to that the film layer A covers the surface C, and thicknesses of the film layer A at different positions may be equal or different. When the film layer A covers the surface C of the film layer B and the thicknesses of the film layers A at different positions are equal, the film layer A and the film layer B may be well matched. For example, when the second semiconductor layer 003 covers the top surface 002*d* and the side 002*c* of the light-emitting layer 002 and the thicknesses of the second semiconductor layer 003 at different positions are equal, the second semiconductor layer 003 and the light-emitting layer 002 may be well matched to ensure the transmitting efficiency of a carrier between the second semiconductor layer 003 and the light-emitting layer 002, thereby ensuring the light-emitting efficiency of the light-emitting unit.

Optionally, as shown in FIG. 1, the display unit further includes an insulating layer 004 located between the first semiconductor layer 001 and the second semiconductor layer 003. The insulating layer 004 may be distributed in the same layer as the light-emitting layer 002. The insulating layer 004 may insulate the first semiconductor layer 001 from the second semiconductor layer 003. The insulating layer 004 may be made of at least one of silicon nitride, silicon oxide or silicon oxynitride. For example, the insulating layer 004 is made of silicon nitride.

Figure 2:
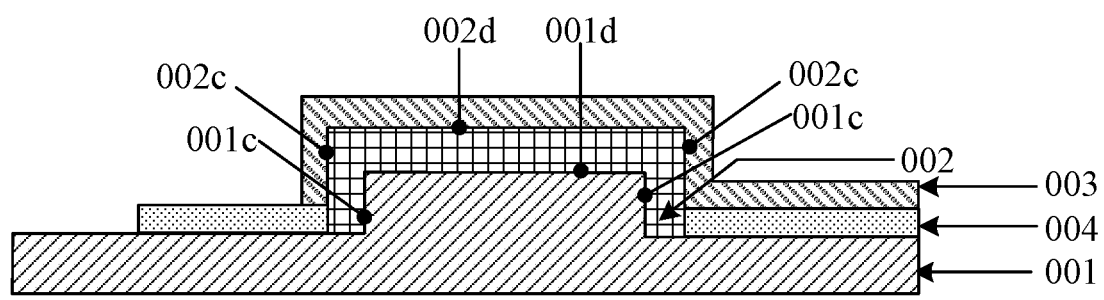
FIG. 2 is a schematic diagram showing a structure of another light-emitting unit according to an embodiment of the present disclosure.
Figure 3:
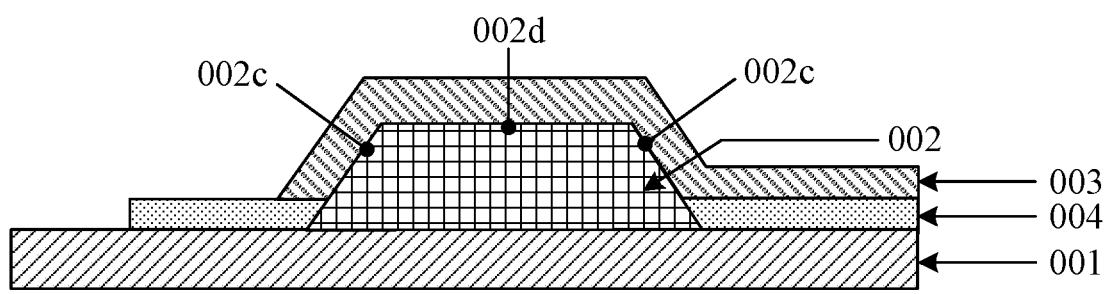
FIG. 3 is a schematic diagram showing a structure of yet another light-emitting unit according to an embodiment of the present disclosure.
Figure 4:
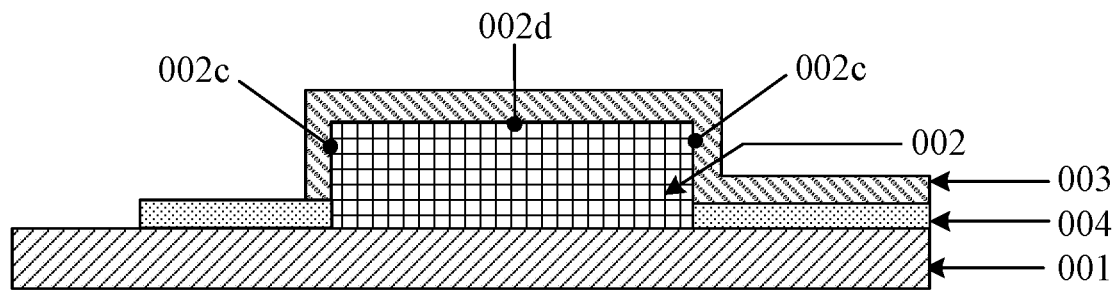
FIG. 4 is a schematic diagram showing a structure of still another light-emitting unit according to an embodiment of the present disclosure.

Optionally, in the embodiment of the present disclosure, the structure of the first semiconductor layer 001 may be implemented in many manners. For example, as shown in FIG. 1 and FIG. 2, the first semiconductor layer 001 has a first convex structure (not shown in FIG. 1 and FIG. 2), and the light-emitting layer 002 at least covers the part of the top surface 001*d* and the part of the side 001*c* of the first convex structure. Alternatively, as shown in FIG. 3 and FIG. 4, a surface of the first semiconductor layer 001, which is close to the light-emitting layer 002, may be a plane. FIG. 2, FIG. 3 and FIG. 4 are schematic diagrams showing a structure of three other light-emitting units according to an embodiment of the present disclosure.

Optionally, as shown in FIG. 1, a vertical cross section of the first convex structure is trapezoidal, and the first convex structure may be of a frustum structure, such as a structure of a frustum of a cone or a structure of prismatic table. Alternatively, as shown in FIG. 2, a vertical cross section of the first convex structure is rectangular, and the first convex structure may be of a columnar structure, such as a cylindrical structure or a prismatic structure. The vertical cross section of the first convex structure may be a cross section, which is vertical to the bottom surface of the first semiconductor layer 001, of cross sections of the first convex structure.

Optionally, in the embodiment of the present disclosure, the structure of the light-emitting layer 002 may be implemented in many manners. For example, as shown in FIG. 1 and FIG. 3, the side 002c of the light-emitting layer 002 may be inclined with respect to the bottom surface of the first semiconductor layer 001. Alternatively, as shown in FIG. 2 and FIG. 4, the side 002c of the light-emitting layer 002 may be vertical relative to the bottom surface of the first semiconductor layer 001. An orthographic projection of the top surface 002d of the light-emitting layer 002 on the first semiconductor layer 001 may be located within an orthographic projection of the light-emitting layer 002 on the first semiconductor layer 001.

Optionally, the top surface 002d of the light-emitting layer 002 may be a plane or a curved surface. As shown in FIG. 1 and FIG. 2, when the first semiconductor layer 001 has the first convex structure and the top surface 002d of the light-emitting layer 002 is the plane, the vertical cross section of the light-emitting layer 002 may be arched. As shown in FIG. 3, when a surface, which is close to the light-emitting layer 002, of the first semiconductor layer 001 is the plane, the top surface 002d of the light-emitting layer 002 is the plane and the side 002c of the light-emitting layer 002 are inclined with respect to the bottom surface of the first semiconductor layer 001, the vertical cross section of the light-emitting layer 002 may be trapezoidal and the light-emitting layer 002 may be of a frustum structure, such as a structure of prismatic table or a structure of a frustum of a cone. As shown in FIG. 4, when a surface, which is close to the light-emitting layer 002, of the first semiconductor layer 001 is the plane, the top surface 002d of the light-emitting layer 002 is the plane. When the side 002c of the light-emitting layer 002 is vertical with respect to the bottom surface of the first semiconductor layer 001, the vertical cross section of the light-emitting layer 002 may be rectangular, and the light-emitting layer 002 may be of the prismatic structure or the cylindrical structure. The vertical cross section of the light-emitting layer 002 may be a cross section of the light-emitting layer 002 in a direction vertical to the bottom surface of the first semiconductor layer 001.

Optionally, as shown in FIG. 1 and FIG. 3, the side 002c of the light-emitting layer 002 is inclined with respect to the bottom surface of the first semiconductor layer 001, and the size of the top surface 002d of the light-emitting layer 002 is smaller than that of the bottom surface of the light-emitting layer 002. The top surface 002d of the light-emitting layer 002 will not block light emitted from the side 002c of the light-emitting layer 002, so that more light may be emitted from the light-emitting unit, which is conducive to improving the light extraction rate of the light-emitting layer 002. As shown in FIG. 2 and FIG. 4, the side 002c of the light-emitting layer 002 are vertical with respect to the bottom surface of the first semiconductor layer 001, and the second semiconductor layer 003 covers the top surface 002d and the side 002c of the light-emitting layer 002, which is conducive to increasing the light-emitting area of the light-emitting unit. The bottom surface of the light-emitting layer 002 may be a surface, which is close to the first semiconductor layer 001, of the surface of the light-emitting layer, and the bottom surface of the first semiconductor layer 001 may be a surface, which is away from the light-emitting layer 002, of the surface of the first semiconductor layer 001.

Figure 5:
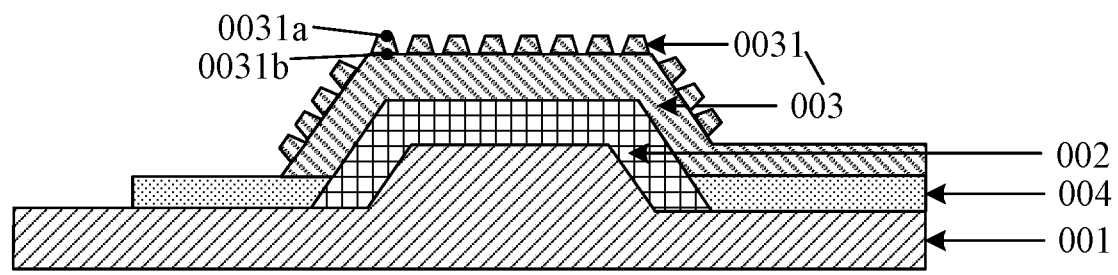
FIG. 5 is a schematic diagram showing a structure of yet still another light-emitting unit according to an embodiment of the present disclosure.

Optionally, reference is made to FIG. 5, which is a schematic diagram showing a structure of yet another light-emitting unit according to an embodiment of the present disclosure. As shown in FIG. 5, a light-emitting surface of the second semiconductor layer 003 may have at least one second convex structure 0031. An orthographic projection of a top surface 0031a of the second convex structure 0031 on the second semiconductor layer 003 is located within an orthographic projection of a bottom surface 0031b of the second convex structure 0031 on the second semiconductor layer 003. As shown in FIG. 5, a vertical cross section of the second convex structure 0031 may be trapezoidal, and bottom angles of the trapezoid may be acute angles. It is readily understood that FIG. 5 is merely exemplary, and the vertical cross section of the second convex structure 0031 may be of an acute-angled triangle, a semicircle, or a rectangle. The vertical cross section of the second convex structure 0031 may be a cross section of the second convex structure 0031 in a direction vertical to the bottom surface of the second semiconductor layer 001. In addition, it is readily understood that the embodiment of the present disclosure describes the second convex structure on the second semiconductor layer 003 based on the light-emitting unit as shown in FIG. 1, and the second semiconductor layer 003 of the light-emitting unit shown in FIG. 2 to FIG. 4 may also have a second convex structure, which will not be defined in the embodiment of the present disclosure.

Optionally, the light-emitting surface of the second semiconductor layer 003 has a plurality of second convex structures 0031, and the plurality of second convex structures 0031 may be evenly distributed on the light-emitting surface of the second semiconductor layer 003, such that the light-emitting surface of the second semiconductor layer 003 may have a periodic convex structure.

In the embodiment of the present disclosure, when the light-emitting surface of the second semiconductor layer 003 has at least one second convex structure 0031, on one hand, the second convex structure 0031 may increase the area of the light-emitting surface of the second semiconductor layer 003 and further increase the light-emitting area of the light-emitting unit; and on the other hand, the second convex structure 0031 may reflect and/or refract light and when an incident angle of the light on the light-emitting surface of the second semiconductor layer 003 is changed and the incident angle of the light is less than the total reflection angle of the light, the light may be emitted from the light-emitting surface of the second semiconductor layer 003 after being refracted. That is, the second convex structure 0031 may destroy the total reflection of the light, so that more light is emitted from the light-emitting surface of the second semiconductor layer 003 and the amount of the light emitted from the light-emitting unit is increased and thus the light extraction efficiency of the light-emitting unit is increased. Moreover, when the light-emitting surface of the second semiconductor layer 003 has a plurality of second convex structures 0031 distributed evenly, the plurality of second convex structures 0031 distributed evenly may reflect and/or refract the light relatively evenly, and the amount of the light emitted from the light-emitting unit is increased and thus the light extraction efficiency of the light-emitting unit is increased.

Figure 6:
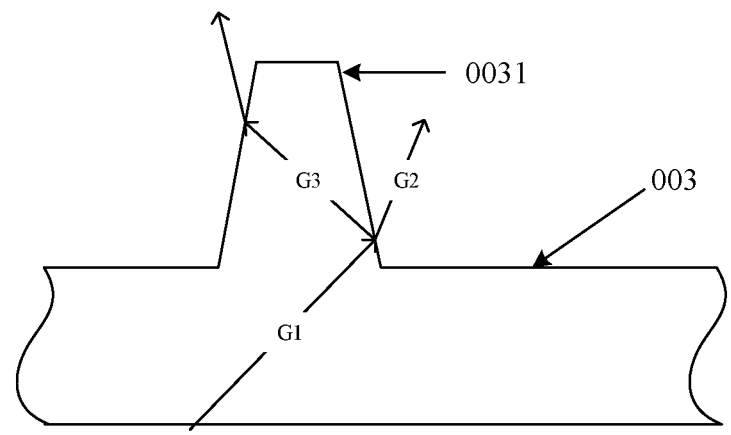
FIG. 6 is a schematic diagram of reflection and refraction of light on a surface of a second convex structure according to an embodiment of the present disclosure.

For example, reference is made to FIG. 6, which is a schematic diagram of propagation of light in a second semiconductor layer 003 according to an embodiment of the present disclosure. When light G1 is irradiated to one side of a second convex structure 0031, a part of the light G1 is refracted to form refracted light G2. The refracted light G2 is emitted from the second convex structure 0031, and a part of the light is reflected to form reflected light G3. When the reflected light G3 is irradiated on the other face of the second convex structure 0031, the reflected light G3 is refracted on the other side and finally emitted from the second convex structure 0031. However, if the light-emitting surface of the second semiconductor layer 003 is the plane, when the light is irradiated to the light-emitting surface, the light is reflected on the light-emitting surface to form reflected light, and the reflected light may be directly irradiated into the light-emitting unit without being emitted from the light-emitting unit. It may be seen that the second convex structure 0031 on the light-emitting surface of the second semiconductor layer 003 may adjust light, so that light that could not originally be emitted from the light-emitting unit may be emitted from the light-emitting unit. As a result, the light extraction rate of the light-emitting unit is increased.

Figure 7:
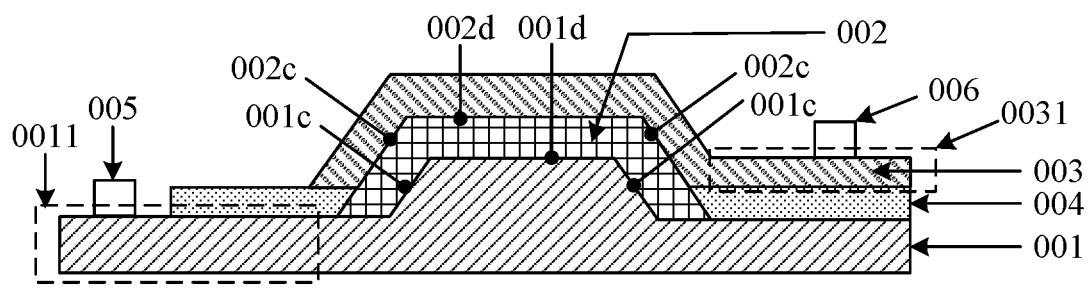
FIG. 7 is a schematic diagram showing a structure of yet still another light-emitting unit according to an embodiment of the present disclosure.

Optionally, reference is made to FIG. 7, which is a schematic diagram showing a structure of still another light-emitting unit according to an embodiment of the present disclosure. As shown in FIG. 7, the light-emitting unit may further include a first electrode 005. The first electrode 005 is electrically connected with the first semiconductor layer 001, and an orthographic projection of the light-emitting layer 002 on the first semiconductor layer 001 is staggered from an orthographic projection of the first electrode 005 on the first semiconductor layer 001. The first electrode 005 is configured to apply a first electrical signal to the first semiconductor layer 001. That the orthographic projection of the light-emitting layer 002 on the first semiconductor layer 001 is staggered from the orthographic projection of the first electrode 005 on the first semiconductor layer 001 refers to that there is no overlapping region between the orthographic projection of the light-emitting layer 002 on the first semiconductor layer 001 and the orthographic projection of the first electrode 005 on the first semiconductor layer 001. Since the orthographic projection of the light-emitting layer 002 on the first semiconductor layer 001 and the orthographic projection of the first electrode 005 on the first semiconductor layer 001 do not overlap, the first electrode 005 does not occupy the light-emitting area of the light-emitting unit, which may ensure that the light-emitting unit has a large light-emitting area.

Reference is made again to FIG. 7. As an implementation of providing the first electrode 005, the first semiconductor layer 001 may include a first light-emitting drive portion (not shown in FIG. 7) and a first extension portion 0011. An orthographic projection of the light-emitting layer 002 on the first semiconductor layer 001 coincides with the first light-emitting drive portion, and the orthographic projection of the light-emitting layer 002 on the first semiconductor layer 001 is staggered from the first extension portion 0011. The first electrode 005 is located on the first extension portion 0011, and the first extension portion 0011 is electrically connected with the first extension portion 0011. The first light-emitting drive portion and the first extension portion 0011 may be of an integrated structure, the first light-emitting drive portion may be a portion, which may be configured to drive the light-emitting layer 002 to emit light, of the first semiconductor layer 001, and the first extension portion 0011 may be a portion of the semiconductor layer 001 except the first light-emitting drive portion. The first electrode 005 may be located at any position of the first extension portion 0011, and the first electrode 005 may be a binding post located on the first extension portion 0011 or a soldering joint of a lead wire for applying the first electrical signal.

Optionally, reference is made again to FIG. 7. The light-emitting unit may further include a second electrode 006, wherein the second electrode 006 is electrically connected with the second semiconductor layer 003, and the orthographic projection of the light-emitting layer 002 on the first semiconductor layer 001 is staggered from an orthographic projection of the second electrode 006 on the first semiconductor layer 001. The second electrode 006 is configured to apply a second electrical signal to the second semiconductor layer 003, and the polarity of the second electrical signal is opposite to that of the first electrical signal. Since the orthographic projection of the light-emitting layer 002 on the first semiconductor layer 001 is staggered from the orthographic projection of the second electrode 006 on the first semiconductor layer 001, the second electrode 006 does not occupy the light-emitting area of the light-emitting unit. Accordingly, it is possible to ensure that the light-emitting unit has a larger light-emitting area.

Reference is made again to FIG. 7. As an implementation of providing the second electrode 006, the second semiconductor layer 003 may include a second light-emitting drive portion (not shown in FIG. 7) and a second extension portion 0031. The orthographic projection of the light-emitting layer 002 on the first semiconductor layer 001 is located within an orthographic projection of the second light-emitting drive portion on the first semiconductor layer 001 and the orthographic projection of the light-emitting layer 002 on the first semiconductor layer 001 is staggered from the orthographic projection of the second extension portion 0031 on the first semiconductor layer 001, the second electrode 006 is located on the second extension portion 0031, and the second electrode 006 is electrically connected with the second extension portion 0031. The second light-emitting drive portion and the second extension portion 0031 may be of an integrated structure, the second light-emitting drive portion may be a portion, which is configured to drive the light-emitting layer 002 to emit light, of the second semiconductor layer 003, and the second extension portion 0031 may be a portion of the second semiconductor layer 003 except the second light-emitting drive portion. The second electrode 006 may be located at any position of the second extension portion 0031, and the second electrode 006 may be a binding post located on the second extension portion 0031 or a soldering joint of a lead wire for applying the second electrical signal.

Figure 8:
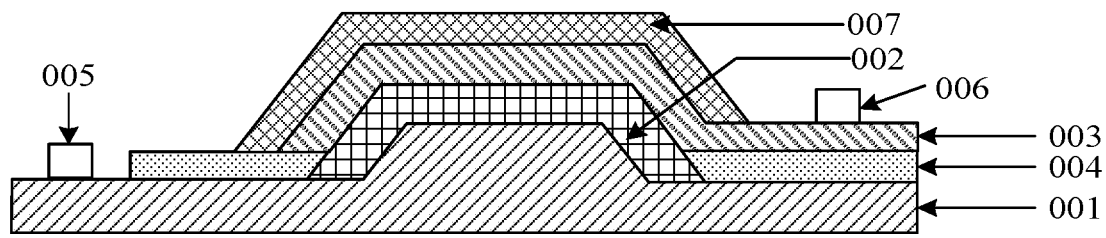
FIG. 8 is a schematic diagram showing a structure of yet still another light-emitting unit according to an embodiment of the present disclosure.
Figure 9:
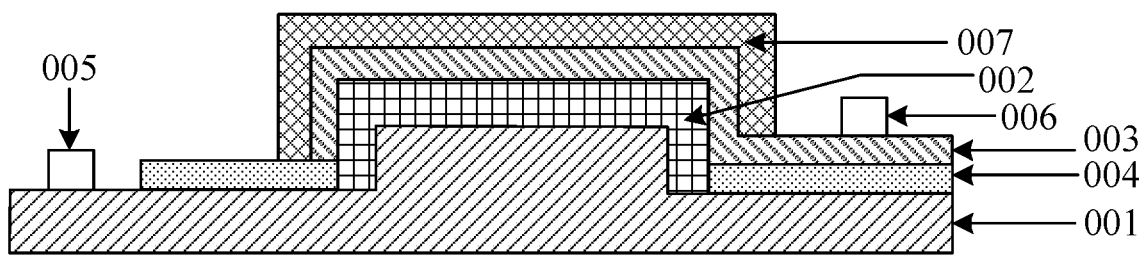
FIG. 9 is a schematic diagram showing a structure of yet still another light-emitting unit according to an embodiment of the present disclosure.

Optionally, reference is made to FIG. 8 and FIG. 9, which are schematic diagrams showing a structure of two other light-emitting units according to an embodiment of the present disclosure. As shown in FIG. 8 and FIG. 9, the light-emitting unit may further include a refractive layer 007 located on one side, which is away from the first semiconductor layer 001, of the second semiconductor layer 003. Optionally, the second semiconductor layer 003 may include a second light-emitting drive portion (not shown in FIG. 8 and FIG. 9) and a second extension portion (not shown in FIG. 8 and FIG. 9). The refractive layer 007 covers the light-emitting surface of the second light-emitting drive portion.

Optionally, the difference between a refractive index of the second semiconductor layer 003 and a refractive index of the refractive layer 007 is less than a preset threshold, and the light transmittance of the refractive layer 007 is greater than that of the second semiconductor layer 003. Alternatively, the refractive index of the refractive layer 007 is smaller than that of the second semiconductor layer 003, and the refractive index of the refractive layer 007 is greater than that of air.

When the difference between the refractive index of the second semiconductor layer 003 and the refractive index of the refractive layer 007 is less than the preset threshold, the difference between the refractive index of the second semiconductor layer 003 and the refractive index of the refractive layer 007 is smaller. Accordingly, the refractive index of the second semiconductor layer 003 is close to that of the refractive layer 007. According to the optical theory, the closer the refractive indices of two media are, the larger the total reflection angle of light when one of the two media enters the other is, and the smaller the total reflection loss is. Therefore, the difference between the refractive index of the second semiconductor layer 003 and the refractive index of the refractive layer 007 is smaller than the preset threshold, which may ensure that as much light as possible is incident on the refractive layer 007 from the second semiconductor layer 003 through refraction. Moreover, according to the law of light propagation, when the light incident on the refractive layer 007 after being refracted by the second semiconductor layer 003 is irradiated on the light-emitting surface of the refractive layer 007, a part of the light will be refracted and a part of the light will be reflected (for the sake of distinction, this part of the light is hereinafter referred to as the light reflected by the light-emitting surface of the refracting layer 007 for the first time), the refracted light may be directly emitted from the refractive layer 007 and irradiated into a free space. When the reflected light is irradiated to an interface between the refractive layer 007 and the second semiconductor layer 003, the reflected light will be reflected again by the interface. The light reflected again will be reflected and refracted when being irradiated to the light-emitting surface of the refractive layer 007. Such a process will be circulated according to this law, and finally it is possible for most of the light reflected by the light-emitting surface of the refractive layer 007 for the first time is emitted from the refractive layer 007 and irradiated into the free space. Moreover, since the light transmittance of the refractive layer 007 is greater than that of the second semiconductor layer 003, it is possible to ensure that as much light as possible is transmitted through the refractive layer 007, and finally the amount of the light, which is finally refracted into the free space, of the light reflected by the light-emitting surface of the refractive layer 007 for the first time is much larger than the amount of light blocked due to the light transmittance of the refractive layer 007, and the refractive layer 007 may increase the amount of light irradiated into the free space.

Figure 10:
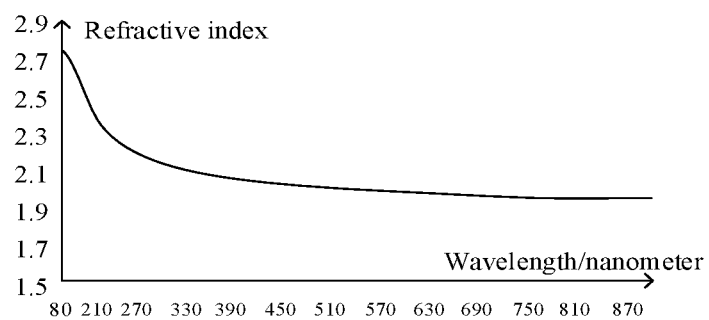
FIG. 10 is a schematic diagram of a refractive index of silicon nitride as a function of a wavelength of light according to an embodiment of the present disclosure.

Optionally, a material of the second semiconductor layer 003 may include metal-doped gallium nitride (GaN), and a material of the refractive layer 007 may include silicon nitride ($Si_3N_4$), the refractive index of the gallium nitride to visible light is about 2.5, and the refractive index of the visible light to air is about 1. When light is incident on air from the gallium nitride, its total reflection angle is about 24° (degrees), and its light extraction rate is about 4% (percent). Optionally, reference is made to FIG. 10, which shows a schematic diagram of a refractive index of silicon nitride as a function of a wavelength of light according to an embodiment of the present disclosure. A vertical axis of FIG. 10 represents a refractive index of the silicon nitride to the light with different wavelengths, and a horizontal axis represents the wavelength of the light in nanometers. According to FIG. 10, it may be seen that the range of the refractive index of the silicon nitride to the visible light (a wavelength range of 380 to 780 nanometers) is [1.9, 2.1]. Since the refractive index of the gallium nitride is close to the refractive index of silicon nitride, experiments have shown that when the light is incident on the silicon nitride from the gallium nitride, its total reflection angle is about 55°, and its light extraction rate is about 50% to 70%. It may be seen that the refractive layer 007 made of the silicon nitride and located on the light-emitting surface of the second semiconductor layer 003, may increase the light extraction efficiency of the light-emitting unit.

When the refractive index of the refractive layer 007 is smaller than that of the second semiconductor layer 003 and the refractive index of the refractive layer 007 is greater than that of air, since the refractive index of the second semiconductor layer 003 is close to that of the refractive layer 007, the total reflection angle of the light incident on the refractive layer 007 from the second semiconductor layer 003 may be increased. Meanwhile, since the refractive index of the refractive layer 007 is close to that of air, the total reflection angle of the light incident on air from the refractive layer 007 may be increased, and the amount of light totally reflected is reduced. Moreover, the refractive layer 007 may enable light to be refracted and reflected at the interface between the second semiconductor layer 003 and the refractive layer 007, and at the light-emitting surface of the refractive layer 007. Accordingly, the amount of light emitted from the light-emitting unit and irradiated into the free space is increased, and further the light extraction efficiency of the light-emitting unit is increased.

Figure 11:
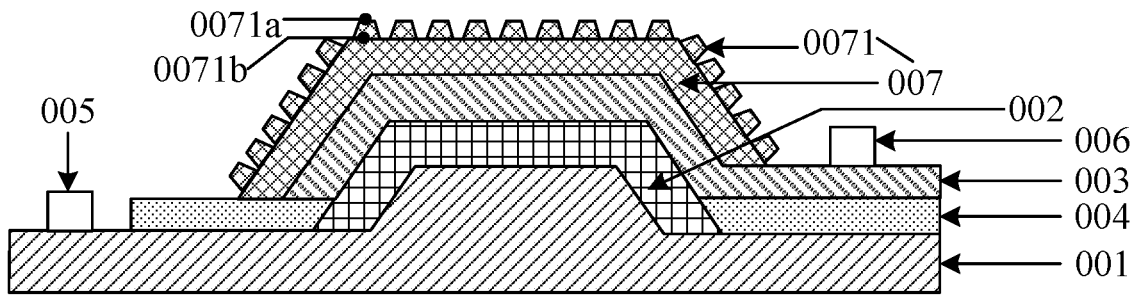
FIG. 11 is a schematic diagram showing a structure of yet still another light-emitting unit according to an embodiment of the present disclosure.
Figure 12:
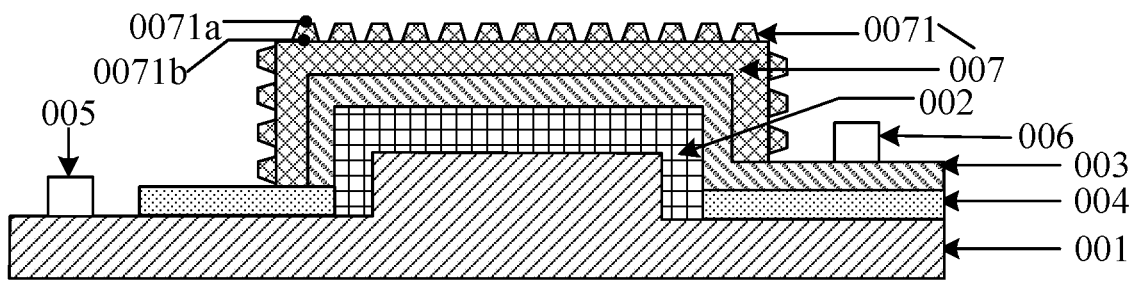
FIG. 12 is a schematic diagram showing a structure of yet still another light-emitting unit according to an embodiment of the present disclosure.

Optionally, reference is made to FIG. 11 and FIG. 12, which are schematic diagrams showing a structure of two other light-emitting units according to an embodiment of the present disclosure. As shown in FIG. 11 and FIG. 12, the light-emitting surface of the refractive layer 007 may have at least one third convex structure 0071, and an orthographic projection of the third convex structure 0071 on the refractive layer 007 is located within an orthographic projection of a bottom surface 0071b of the third convex structure 0071 on the refractive layer 007. A vertical cross section of the third convex structure 0071 may be trapezoidal, and bottom angles of the trapezoid may be acute angles. It is readily understood that FIG. 11 and FIG. 12 are merely exemplary, and the vertical cross section of the third convex structure 0071 may be of an acute-angled triangle, a semicircle, or a rectangle. The vertical cross section of the third convex structure 0071 may be a cross section of the third convex structure 0071 in a direction vertical to the bottom surface of the second semiconductor layer 001. In addition, it is readily understood that the embodiment of the present disclosure describes the refractive layer 007 based on the light-emitting unit shown in FIG. 1 and FIG. 2. Additionally providing the refractive layer 007 based on the light-emitting unit shown in FIG. 3 and FIG. 4 may refer to this embodiment, which will not be defined in the embodiment of the present disclosure.

Optionally, as shown in FIG. 11 and FIG. 12, the light-emitting surface of the refractive layer 007 has a plurality of third convex structures 0071, and the plurality of third convex structures 0071 may be evenly distributed on the light-emitting surface of the refractive layer 007. In this way, it is possible to enable the light-emitting surface of the refractive layer 007 to have a periodic convex structure.

In the embodiment of the present disclosure, when the light-emitting surface of the refractive layer 007 has at least one third convex structure 0071, on one hand, the third convex structure 0071 may increase the area of the light-emitting surface of the refractive layer 007 and further increase the light-emitting area of the light-emitting unit; and on the other hand, the third convex structure 0071 may reflect and/or refract light, and the amount of the light emitted from the light-emitting unit may be increased by the reflection and/or refraction (please refer to the related principle of the second convex structure correspondingly for the principle of the third convex structure 0071). Moreover, when the light-emitting surface of the refractive layer 007 has a plurality of third convex structures 0071 distributed evenly, the plurality of third convex structures 0071 distributed evenly may reflect and/or refract light in a relatively balanced manner. Accordingly, the amount of the light emitted from the light-emitting unit is increased, and further the light extraction efficiency of the light-emitting unit is increased.

Optionally, the light-emitting unit may be a structure capable of emitting light, such as a micro LED device or an LED device. It is assumed that the light-emitting unit shown in FIG. 11 is the micro LED device, and the height of the light-emitting unit is 2 μm and the diameter thereof is 10 μm. Experiments have shown that the light-emitting area of the light-emitting unit shown in FIG. 11 is increased by at least 30 square micrometers compared to the light-emitting area of the micro LED device known to the inventors. Therefore, the solution provided by the embodiment of the present disclosure may increase the light-emitting area of the light-emitting unit.

In summary, the light-emitting unit provided by the embodiment of the present disclosure includes the first semiconductor layer, the light-emitting layer and the second semiconductor layer that are distributed in a stacking manner. At least one of the first semiconductor layer or the second semiconductor layer is at least in contact with the part of layer surface and the part of side of the light-emitting layer, so that both the layer surfaces and the side of the light-emitting layer may emit light, which is conducive to increasing the light-emitting area of the light-emitting layer. Accordingly, the light-emitting area and the light extraction efficiency of the light-emitting unit are increased.

Figure 13:
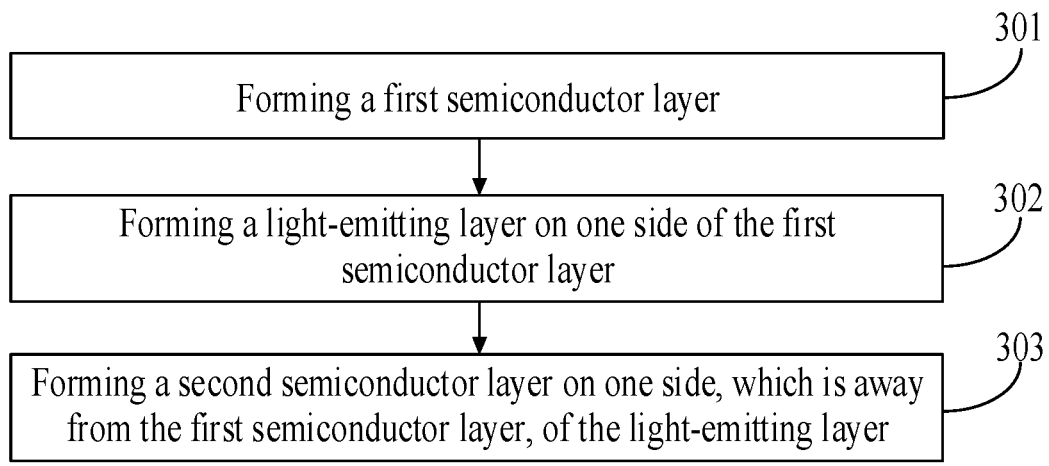
FIG. 13 is a flow diagram of a manufacturing method for a light-emitting unit according to an embodiment of the present disclosure.

Reference is made to FIG. 13, which shows a flow diagram of a manufacturing method for a light-emitting unit according to an embodiment of the present disclosure. As shown in FIG. 13, the method may include the following steps.

In step 301, a first semiconductor layer is formed.

In step 302, a light-emitting layer is formed on one side of the first semiconductor layer.

In step 303, a second semiconductor layer is formed on one side, which is away from the first semiconductor layer, of the light-emitting layer.

At least one of the first semiconductor layer or the second semiconductor layer is at least in contact with a part of layer surface and a part of side of the light-emitting layer, and the first semiconductor layer is insulated from the second semiconductor layer. One of the first semiconductor layer and the second semiconductor layer is an N-type semiconductor layer, and the other is a P-type semiconductor layer. For example, the first semiconductor layer may be an N-type semiconductor layer, and the second semiconductor layer may be a P-type semiconductor layer. Alternatively, the first semiconductor layer may be a P-type semiconductor layer, and the second semiconductor layer may be an N-type semiconductor layer.

In summary, according to the manufacturing method for the light-emitting unit provided by the embodiment of the present disclosure, the light-emitting unit manufactured by the method includes the first semiconductor layer, the light-emitting layer and the second semiconductor layer that are distributed in a stacking manner. At least one of the first semiconductor layer or the second semiconductor layer is at least in contact with the part of layer surface and the part of side of the light-emitting layer. Accordingly, the layer surface and the side of the light-emitting layer may emit light, which is conducive to increasing the light-emitting area of the light-emitting layer. Accordingly, the light-emitting area and the light extraction efficiency of the light-emitting unit are increased.

It is readily understood for those skilled in the art that the light-emitting unit is usually located on a base substrate. In general, when the light-emitting unit is manufactured, the base substrate may be firstly provided, and then respective film layers of the light-emitting unit are formed on the base substrate. The manufacturing method for the light-emitting unit will be described below by taking an example that the first semiconductor layer is the N-type semiconductor layer, the second semiconductor layer is the P-type semiconductor layer, and the individual film layers of the light-emitting unit are formed on the base substrate.

Figure 14:
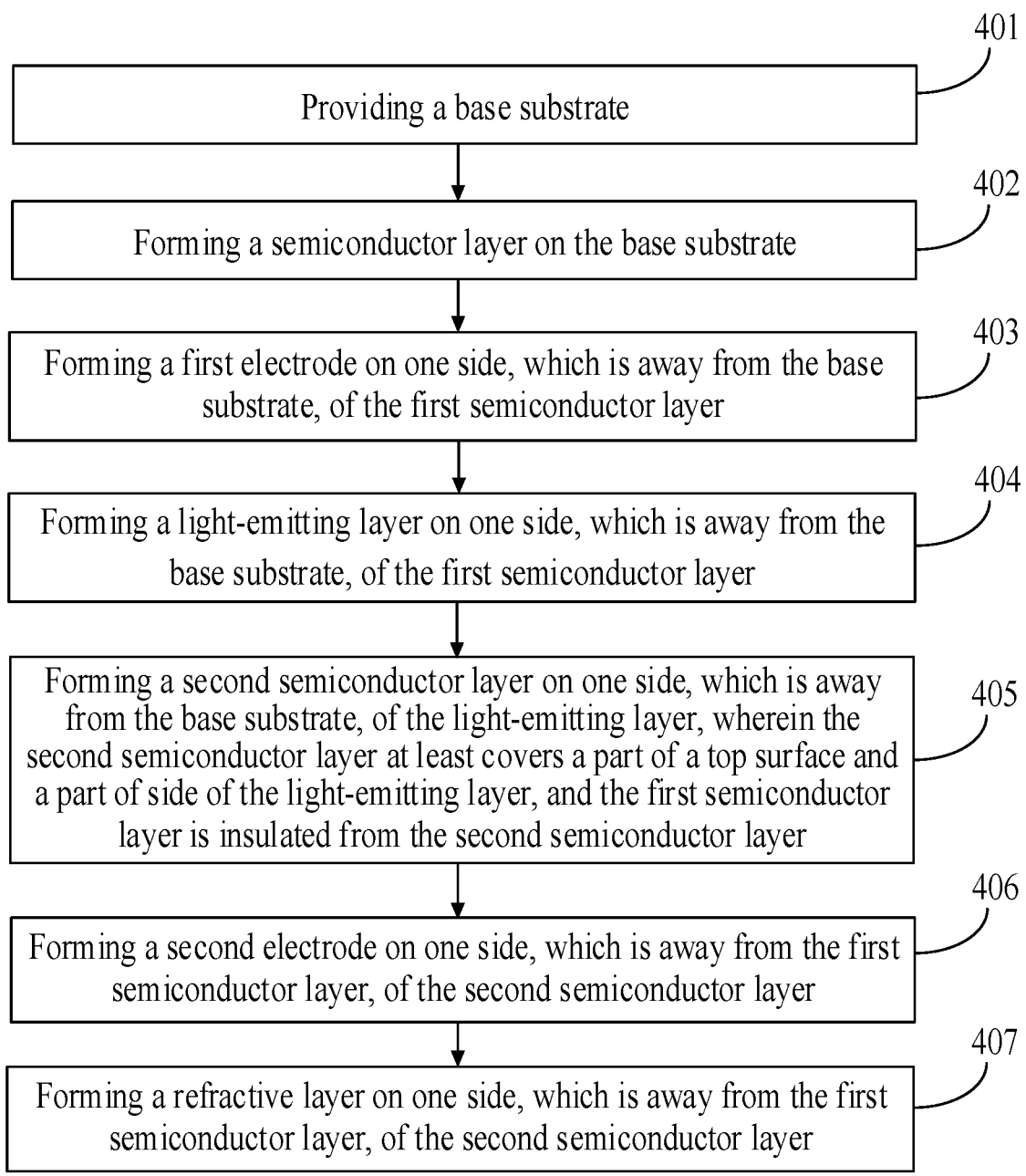
FIG. 14 is a flow diagram of another manufacturing method for a light-emitting unit according to an embodiment of the present disclosure.

For example, reference is made to FIG. 14, which is a flow diagram of another manufacturing method for a light-emitting unit according to an embodiment of the present disclosure. As shown in FIG. 14, the method may include the following steps.

In step 401, a base substrate is provided.

The base substrate may be a transparent substrate, which may be a rigid substrate made of a light-transmitting material with a certain hardness, such as glass, quartz, or a transparent resin. Alternatively, the base substrate may be a flexible substrate made of a flexible material such as polyimide (PI).

In step 402, a first semiconductor layer is formed on the base substrate.

Optionally, the first semiconductor layer may be made of a semiconductor material doped with non-metal, for example, the first semiconductor material may be gallium nitride doped with silicon.

Optionally, a first semiconductor thin film layer with a certain thickness is formed on the base substrate by using the gallium nitride doped with silicon through any one of methods such as magnetron sputtering, thermal evaporation, or plasma enhanced chemical vapor deposition (PECVD), and then the first semiconductor thin film layer is patterned by one patterning process to obtain the first semiconductor layer. The one patterning process may include photoresist coating, exposure, development, etching, and photoresist stripping.

Optionally, the structure of the first semiconductor layer may be implemented in many manners. For example, one surface, which is away from the base substrate, of the first semiconductor layer may be a plane, or one surface, which is away from the base substrate, of the first semiconductor layer may have a first convex structure, and the first convex structure may be a frustum structure or a columnar structure. Moreover, the first semiconductor layer of any structure may include a first light-emitting drive portion and a first extension portion, and the first light-emitting drive portion may be electrically connected with the first extension portion. For example, the first light-emitting drive portion and the first extension portion may be an integrated structure.

In the embodiment of the present disclosure, the first semiconductor thin film layer may be patterned according to actual needs to obtain the first semiconductor layer with different structures that meeting different actual needs. In the embodiments of the present disclosure, the following two achievable modes are taken as examples to illustrate the patterning process of the first semiconductor thin film layer.

In one achievable mode, when one surface, which is away from the base substrate, of the first semiconductor layer is the plane, since the first semiconductor thin film layer is of a whole layer structure, the thickness of the whole layer structure may be equal to the thickness of the first semiconductor layer to be formed, when the first semiconductor thin film layer is patterned, a photoresist may be firstly coated on the surface, which is away from the base substrate, of the first semiconductor thin film layer, and then the photoresist may be exposed and developed by using a mask to remove the photoresist on the first semiconductor thin film layer except the corresponding region of the first semiconductor layer to be formed, then the first semiconductor thin film layer is etched, and finally the remaining photoresist is stripped to obtain the first semiconductor layer one surface of which is the plane away from the base substrate.

In another achievable mode, when the first semiconductor layer to be formed has a first convex structure on one surface which is away from the base substrate, and the first semiconductor layer includes a first light-emitting drive portion and a first extension portion, since the first semiconductor thin film layer is of a whole layer structure, the thickness of the whole layer structure may be equal to the thickness of the first light-emitting drive portion of the first semiconductor layer, when the first semiconductor thin film layer is patterned, a photoresist is firstly coated on the surface, which is away from the base substrate, of the first semiconductor thin film layer, and then the photoresist is exposed and developed by using a halftone mask to obtain a photoresist pattern. The photoresist pattern includes a first photoresist region and a second photoresist region, the first photoresist region corresponds to a first convex structure of the first semiconductor layer to be formed, the second photoresist region corresponds to a first extension portion of the first semiconductor layer to be formed and the thickness of the first photoresist region is greater than that of the second photoresist region. Next, the first semiconductor thin film layer is etched by using the photoresist pattern as a mask to remove a portion on the first semiconductor thin film layer except the first semiconductor layer to be formed. Then, the photoresist pattern is asked to remove the second photoresist region and thin the first photoresist region. Then, the first semiconductor thin film layer is half-etched by using the first photoresist region as a mask to obtain the first extension portion. Finally, the remaining photoresist is finally stripped to obtain the first light-emitting drive portion, so as to obtain a first semiconductor layer with a first convex structure on one surface which is away from the base substrate. The side of the first convex structure may be inclined or vertical with respect to the bottom surface of the first semiconductor layer.

In step 403, a first electrode is formed on one side, which is away from the base substrate, of the first semiconductor layer.

Optionally, the first electrode may be made of a conductive material such as a metal oxide or a non-metal oxide. For example, the first electrode may be made of indium tin oxide (ITO).

Optionally, a first electrode film with a certain thickness may be formed on one side, which is away from the base substrate, of the first semiconductor layer by using a conductive material through any one of methods such as magnetron sputtering, thermal evaporation, or PECVD. Then, the first electrode thin film layer is patterned through one patterning process to obtain a first electrode, wherein the first electrode may be located on the first extension portion of the first semiconductor layer, and the first electrode is electrically connected with the first semiconductor layer. The first electrode is configured to apply a first electrical signal to the first semiconductor layer. Optionally, the first electrode is electrically connected with the first extension portion, so that the first electrode is electrically connected with the first semiconductor layer. The one patterning process may include photoresist coating, exposure, development, etching, and photoresist stripping.

In step 404, a light-emitting layer is formed on one side, which is away from the base substrate, of the first semiconductor layer.

Optionally, the light-emitting layer may be made of a quantum hydrazine material. For example, the light-emitting layer may be made of a mixed material (InGaN/GaN) of indium gallium nitride and gallium nitride.

Optionally, a light-emitting thin film layer with a certain thickness may be formed on one side, which is away from the base substrate, of the first semiconductor layer by using a quantum well material through any one of methods such as magnetron sputtering, thermal evaporation, or PECVD. Then, the light-emitting thin film layer is patterned through one patterning process to obtain a light-emitting layer. The one-time patterning process may include photoresist coating, exposure, development, etching, and photoresist stripping.

Optionally, the orthographic projection of the light-emitting layer on the first semiconductor layer is staggered from the orthographic projection of the first electrode on the first semiconductor layer, so that the first electrode does not block the light-emitting layer, and the first electrode does not occupy the light-emitting area of the light-emitting unit. Accordingly, it is possible to ensure that the light-emitting unit has a larger light-emitting area. When the first electrode is located on the first extension portion, positions of the first extension portion and the light-emitting layer may meet the following condition: the orthographic projection of the light-emitting layer on the first semiconductor layer is staggered from the orthographic projection of the first extension portion on the first semiconductor layer, which ensures that the orthographic projection of the light-emitting layer on the first semiconductor layer is staggered from the orthographic projection of the first electrode on the first semiconductor layer.

It is readily understood that the structure of the light-emitting layer is different according to the structure of the first semiconductor layer. For example, when one side, which is away from the base substrate, of the first semiconductor layer is the plane, the light-emitting layer may have a frustum structure, for example, the light-emitting layer may have a structure of prismatic table or a structure of a frustum of a cone. When the first semiconductor layer has the first convex structure on the side away from the base substrate, the vertical cross section of the light-emitting layer may be arched, and the light-emitting layer at least covers a part of a top surface and a part of side of the first convex structure. Optionally, the side of the first convex structure may be inclined or vertical with respect to the bottom surface of the first semiconductor layer, and accordingly, the side of the light-emitting layer may be inclined or vertical with respect to the bottom surface of the first semiconductor layer.

In step 405, a second semiconductor layer is formed on one side, which is away from the first semiconductor layer, of the light-emitting layer, the second semiconductor layer at least covers the part of the top surface and the part of the side of the light-emitting layer, and the first semiconductor layer is insulated from the second semiconductor layer.

Optionally, the second semiconductor material may be a metal-doped semiconductor material, for example, the second semiconductor material may be gallium nitride doped with magnesium.

Optionally, a second semiconductor thin film layer with a certain thickness may be formed on one side, which is away from the first semiconductor layer, of the light-emitting layer by using the gallium nitride doped with magnesium through any one of methods such as magnetron sputtering, thermal evaporation, or PECVD. Then, the second semiconductor thin film layer is patterned through one patterning process to obtain the second semiconductor layer, wherein the second semiconductor layer at least covers the part of the top surface and the part of the side of the light-emitting layer. The one patterning process may include photoresist coating, exposure, development, etching, and photoresist stripping.

Optionally, the structure of the second semiconductor layer may be implemented in many manners. For example, a surface, which is away from the first semiconductor layer, of the second semiconductor layer may be a plane, or a surface, which is away from the first semiconductor layer, of the second semiconductor layer may have at least one second convex structure or a plurality of second convex structures distributed evenly, and the second convex structure may have a frustum structure or a columnar structure. Moreover, the second semiconductor layer of any structure may include a second light-emitting drive portion and a second extension portion. The second light-emitting drive portion covers a part of a top surface and a part of side of the light-emitting layer. An orthographic projection of the light-emitting layer on the first semiconductor layer is staggered from an orthographic projection of the second extension portion on the first semiconductor layer. When the surface, which is away from the first semiconductor layer, of the second semiconductor layer is the plane and when the surface, which is away from the first semiconductor layer, of the second semiconductor layer has the second convex structure, the manufacturing method for the second semiconductor layer may refer to the two achievable modes in step 402, which will be omitted in the embodiment of the present disclosure.

In the embodiment of the present disclosure, since the second extension portion does not need to cover the top surface and the side of the light-emitting layer, the second extension portion may be provided in a tiled manner (that is, an extension direction of the second extension portion is parallel to the substrate surface of the base substrate). In the technology known to the inventors, it is not possible to provide the second extension portion in a tiled manner, so that the technical difficulty in providing the corresponding film layer is relatively large, and the integration difficulty of the light-emitting unit is increased. The embodiment of the present disclosure may simplify the manufacturing difficulty of the second extension portion by providing the second extension portion in the tiled manner, and is beneficial to the integration of the light-emitting unit.

In the embodiment of the present disclosure, the first semiconductor layer is insulated from the second semiconductor layer. Therefore, before the second semiconductor layer is formed, the insulating layer may be formed on one side, which is away from the base substrate, of the first semiconductor layer. The insulating layer may be located on the same layer as the light-emitting layer, and covers a portion, which is not covered by the light-emitting layer, of the first semiconductor layer. Then, the second semiconductor layer is formed, so that the second semiconductor layer may be insulated from the first semiconductor layer.

In step 406, a second electrode is formed on one side, which is away from the first semiconductor layer, of the second semiconductor layer.

Optionally, the second electrode may be made of a conductive material such as a metal oxide or a non-metal oxide, for example, the second electrode may be made of ITO.

Optionally, a second electrode thin film layer with a certain thickness may be formed on one side, which is away from the first semiconductor layer, of the second semiconductor layer by using the conductive material through any one of methods such as magnetron sputtering, thermal evaporation, or PECVD. Then, the second electrode thin film layer is patterned through one patterning process to obtain the second electrode, wherein the second electrode may be located on the second extension portion of the second semiconductor layer, and the second electrode is electrically connected with the second semiconductor layer. The second electrode is configured to apply a second electrical signal to the second semiconductor layer, and the polarity of the second electrical signal is opposite to that of the first electrical signal applied to the first semiconductor layer. Optionally, the second electrode is electrically connected with the second extension portion, so that the second electrode is electrically connected with the second semiconductor layer. The one patterning process may include photoresist coating, exposure, development, etching, and photoresist stripping.

In step 407, a refractive layer is formed on one side, which is away from the first semiconductor layer, of the second semiconductor layer.

Optionally, the difference between a refractive index of the second semiconductor layer and a refractive index of the refractive layer may be smaller than a preset threshold, and the light transmittance of the refractive layer is greater than that of the second semiconductor layer. Alternatively, the refractive index of the refractive layer may be smaller than that of the second semiconductor layer, and the refractive index of the refractive layer is greater than that of air. For example, when a material of the second semiconductor layer includes gallium nitride doped with magnesium, and a material of the refractive layer may include silicon nitride.

Optionally, a refractive thin film layer with a certain thickness may be formed on one side, which is away from the first semiconductor layer, of the second semiconductor layer by using silicon nitride through any one of methods such as magnetron sputtering, thermal evaporation, or PECVD. The refractive thin film layer is patterned by one patterning process to obtain the refractive layer, wherein the refractive layer may cover a second light-emitting drive portion of the second semiconductor layer. Optionally, the light-emitting surface of the refractive layer (that is, one surface, which is away from the second semiconductor layer, of the refractive layer) may be a plane. Alternatively, the light-emitting surface of the refractive layer may have at least one third convex structure or a plurality of third convex structures evenly distributed. When the light-emitting surface of the refractive layer is the plane, and when the light-emitting surface of the refractive layer has the third convex structure, the manufacturing method for the refractive layer may refer to the two achievable modes in step 402, which will be omitted in the embodiment of the present disclosure.

In summary, the light-emitting unit manufactured by using the manufacturing method for the light-emitting unit provided by the embodiment of the present disclosure includes the first semiconductor layer, the light-emitting layer and the second semiconductor layer that are distributed in a stacking manner. At least one of the first semiconductor layer or the second semiconductor layer is at least in contact with the part of the layer surface and the part of the side of the light-emitting layer. Accordingly, the layer surface and the side of the light-emitting layer may emit light, which is conducive to increasing the light-emitting area of the light-emitting layer. Accordingly, the light-emitting area and the light extraction efficiency of the light-emitting unit are increased.

It is readily appreciated for those skilled in the art that the order of the steps of the manufacturing method for the light-emitting unit provided by the embodiment of the present disclosure may be appropriately adjusted, and the steps may be increased or decreased accordingly as required. Variations that may be readily conceived within the technical scope of the present disclosure by those skilled in the art should fall within the protective scope of the present disclosure, and therefore will be omitted here.

Based on the same inventive concept, an embodiment of the present disclosure provides a display device. The display device may include a light-emitting unit provided by the embodiment of the present disclosure. The light-emitting unit may be a micro LED device. Optionally, the display device may include a pixel, wherein the pixel may include a thin film transistor and the light-emitting unit. Moreover, the display device may further include a plurality of data lines, wherein the data lines may be electrically connected with a source of the thin film transistor, and all the data lines of the display device may be located within the same layer.

Optionally, the display device may be a liquid crystal panel, electronic paper, an organic light-emitting diode (OLED) panel, a mobile phone, a tablet computer, a television, a display, a notebook computer, a digital photo frame, or a navigation instrument or any other device or component with a display function.

In the present disclosure, the term "electrical connection" refers to connection and capability of transmitting an electrical signal, but is not limited to the necessity of transmitting the electrical signal. For example, "A is electrically connected with B" refers to that A is connected with B and the electrical signal may be transmitted between A and B, but it is restricted that the electrical signal must be transmitted between A and B.

In the present disclosure, the terms such as "first", "second", "third" and "fourth" are merely for a descriptive purpose, and cannot be understood as indicating or implying a relative importance. The term "a plurality of" means two or more in number, unless otherwise defined.

The term "and/or" in the present disclosure merely describes the association relationship between the associated objects and indicates that there may be three relationships. For example, A and/or B may indicate three cases where only A exists, A and B exist at the same time and only B exists. The character "/" in the present disclosure generally indicates that the relationship between the former and later associated objects is "OR".

The term "at least one of A and B" in the present disclosure merely describes the association relationship between the associated objects and indicates that there may be three relationships; for example, at least one of A and B may indicate three cases where only A exists, A and B exist at the same time, or only B exists. Likewise, "at least one of A, B and C" may indicate seven relationships that A exists alone, B exists alone, C exists alone, A and B exist simultaneously, A and C exist simultaneously, C and B exist simultaneously, and A, B and C exist simultaneously.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

The invention claimed is:

1. A light-emitting unit, comprising a first semiconductor layer, a light-emitting layer and a second semiconductor layer distributed in a stacking manner, wherein,
the first semiconductor layer is in contact with a part of a bottom surface and a part of a side of the light-emitting layer, the second semiconductor layer is in contact with a part of a top surface and a part of a side of the light-emitting layer, and both the top surface and the bottom surface of the light-emitting layer are flat surfaces,
the first semiconductor layer is insulated from the second semiconductor layer, and
one of the first semiconductor layer and the second semiconductor layer is an N-type semiconductor layer and the other is a P-type semiconductor layer; and
wherein
the light-emitting unit further comprises a first electrode and a second electrode,
the first electrode is electrically connected with the first semiconductor layer, and an orthographic projection of the light-emitting layer on the first semiconductor layer is staggered from an orthographic projection of the first electrode on the first semiconductor layer; and
the second electrode is electrically connected with the second semiconductor layer, and the orthographic projection of the light-emitting layer on the first semiconductor layer is staggered from an orthographic projection of the second electrode on the first semiconductor layer.

2. The light-emitting unit according to claim 1, wherein the second semiconductor layer at least covers a part of the top surface and the part of the side of the light-emitting layer, and the top surface of the light-emitting layer is a surface, which is away from the first semiconductor layer, of two layer surfaces of the light-emitting layer.

3. The light-emitting unit according to claim 1, wherein the second semiconductor layer covers all the top surface and all the side of the light-emitting layer.

4. The light-emitting unit according to claim 1, wherein the first semiconductor layer has a first convex structure, and the light-emitting layer at least covers a part of a top surface and a part of a side of the first convex structure.

5. The light-emitting unit according to claim 1, wherein the side of the light-emitting layer is inclined with respect to a bottom surface of the first semiconductor layer; or, the side of the light-emitting layer is vertical with respect to a bottom surface of the first semiconductor layer.

6. The light-emitting unit according to claim 1, wherein an orthographic projection of the top surface of the light-emitting layer on the first semiconductor layer is located within an orthographic projection of the light-emitting layer on the first semiconductor layer.

7. The light-emitting unit according to claim 1, wherein a light-emitting surface of the second semiconductor layer has at least one second convex structure.

8. The light-emitting unit according to claim 7, wherein the light-emitting surface of the second semiconductor layer has a plurality of the second convex structures, and the plurality of the second convex structures are evenly distributed.

9. The light-emitting unit according to claim 1, wherein the first semiconductor layer comprises a first light-emitting drive portion and a first extension portion, and an orthographic projection of the light-emitting layer on the first semiconductor layer coincides with the first light-emitting drive portion and is staggered from the first extension portion, and the first electrode is located on the first extension portion and electrically connected with the first extension portion; and the second semiconductor layer comprises a second light-emitting drive portion and a second extension portion, and the orthographic projection of the light-emitting layer on the first semiconductor layer is located within an orthographic projection of the second light-emitting drive portion on the first semiconductor layer, the orthographic projection of the light-emitting layer on the first semiconductor layer is staggered from an orthographic projection of the second extension portion on the first semiconductor layer, and the second electrode is located on the second extension portion and electrically connected with the second extension portion.

10. The light-emitting unit according to claim 1, wherein the light-emitting unit further comprises a refractive layer, and the refractive layer is located on one side, which is away from the first semiconductor layer, of the second semiconductor layer.

11. The light-emitting unit according to claim 10, wherein the difference between a refractive index of the second semiconductor layer and a refractive index of the refractive layer is less than a preset threshold, and the light transmittance of the refractive layer is greater than that of the second semiconductor layer; or, the refractive index of the refractive layer is smaller than that of the second semiconductor layer, and the refractive index of the refractive layer is greater than that of air.

12. The light-emitting unit according to claim 10, wherein a light-emitting surface of the refractive layer has at least one third convex structure, or a light-emitting surface of the refractive layer has a plurality of third convex structures, and the plurality of third convex structures are evenly distributed.

13. The light-emitting unit according to claim 1, wherein the light-emitting unit comprises a micro LED (light-emitting diode) device.

14. A method for manufacturing a light-emitting unit, comprising:
   forming a first semiconductor layer;
   forming a light-emitting layer on one side of the first semiconductor layer; and
   forming a second semiconductor layer on one side, which is away from the first semiconductor layer, of the light-emitting layer; and
   wherein the first semiconductor layer is in contact with a part of a bottom surface and a part of a side of the light-emitting layer, the second semiconductor layer is in contact with a part of a top surface and a part of a side of the light-emitting layer, and both the top surface and the bottom surface of the light-emitting layer are flat surfaces, the first semiconductor layer is insulated from the second semiconductor layer, and one of the first semiconductor layer and the second semiconductor layer is an N-type semiconductor layer and the other is a P-type semiconductor layer; and wherein after forming the first semiconductor layer, the method further comprises:
   forming a first electrode on one side of the first semiconductor layer; and
after forming a second semiconductor layer on one side, which is away from the first semiconductor layer, of the light-emitting layer, the method further comprises:
   forming a second electrode on one side, which is away from the first semiconductor layer, of the second semiconductor layer; and
wherein,
the first electrode is electrically connected with the first semiconductor layer, and an orthographic projection of the light-emitting layer on the first semiconductor layer is staggered from an orthographic projection of the first electrode on the first semiconductor layer; and
the second electrode is electrically connected with the second semiconductor layer, and the orthographic projection of the light-emitting layer on the first semiconductor layer is staggered from an orthographic projection of the second electrode on the first semiconductor layer.

15. The method according to claim 14, wherein
the forming a first semiconductor layer comprises:
   forming a first semiconductor thin film layer; and
   patterning the first semiconductor thin film layer to obtain the first semiconductor layer, wherein one surface of the first semiconductor layer has a first convex structure; and
the forming the light-emitting layer on one side of the first semiconductor layer comprises:
   forming a light-emitting thin film layer on one side, which has the first convex structure, of the first semiconductor layer; and
   patterning the light-emitting thin film layer to obtain the light-emitting layer, wherein the light-emitting layer at least covers a part of a top surface and a part of side of the first convex structure.

16. The method according to claim 15, wherein
the forming the second semiconductor layer on one side, which is away from the first semiconductor layer, of the light-emitting layer comprises:
forming a second semiconductor thin film layer on one side, which is away from the first semiconductor layer, of the light-emitting layer; and
patterning the second semiconductor thin film layer to obtain the second semiconductor layer, wherein a light-emitting surface of the second semiconductor layer has at least one second convex structure.

17. The method according to claim 14, wherein
after forming the second semiconductor layer on one side, which is away from the first semiconductor layer, of the second semiconductor layer, the method further comprises:
forming a refractive layer on one side, which is away from the first semiconductor layer, of the second semiconductor layer.

18. The method according to claim 17, wherein
the forming the refractive layer on one side, which is away from the first semiconductor layer, of the second semiconductor layer comprises:
forming a refractive thin film layer on one side, which is away from the first semiconductor layer, of the second semiconductor layer; and patterning the refractive film layer to obtain the refractive layer, wherein a light-emitting surface of the refractive layer has at least one third convex structure.

\* \* \* \* \*